(12) United States Patent
Larsson et al.

(10) Patent No.: US 9,362,029 B2
(45) Date of Patent: *Jun. 7, 2016

(54) CABLE SEALING DEVICE IN A FUEL DISPENSER

(71) Applicant: Wayne Fueling Systems Sweden AB, Malmo (SE)

(72) Inventors: Bengt I. Larsson, Malmo (SE); Nina Jeppsson, Malmo (SE); Richard Carlsson, Malmo (SE); Christer Lundgren, Malmo (SE); Jonas Folkell, Malmo (SE); Petter Theren, Malmo (SE)

(73) Assignee: Wayne Fueling Systems Sweden AB, Malmo (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/620,632

(22) Filed: Feb. 12, 2015

(65) Prior Publication Data

US 2015/0162116 A1 Jun. 11, 2015

Related U.S. Application Data

(63) Continuation of application No. 13/576,947, filed as application No. PCT/EP2010/051308 on Feb. 3, 2010, now Pat. No. 8,981,229.

(51) Int. Cl.
*H01R 9/16* (2006.01)
*H01B 17/30* (2006.01)
(Continued)

(52) U.S. Cl.
CPC .............. *H01B 17/301* (2013.01); *B67D 7/06* (2013.01); *H01B 17/265* (2013.01); *H02G 3/22* (2013.01); *H05K 5/0247* (2013.01); *Y10T 16/05* (2015.01)

(58) Field of Classification Search
CPC ...... H01B 17/301; H01B 17/265; H02G 3/22; H05K 5/0247; Y10T 16/05; B67D 7/04; B67D 7/06; B67D 7/84
USPC ............................ 174/153 R; 222/71–75, 173
See application file for complete search history.

(56) References Cited

U.S. PATENT DOCUMENTS 2,345,792 A * 4/1944 Cann .................... H01M 2/1072
174/153 R
3,534,323 A * 10/1970 Wengen ................ H01B 17/306
174/145

(Continued)

FOREIGN PATENT DOCUMENTS

| DE | 3105457 A1 | 8/1982 |
|----|------------|--------|
| DE | 202004016368 U1 | 12/2004 |
| EP | 1333007 A1 | 8/2003 |

OTHER PUBLICATIONS

International Search Report and Written Opinion issued in International Application No. PCT/EP2010/051308 dated Jul. 27, 2011.

*Primary Examiner* — Patrick M Buechner
(74) *Attorney, Agent, or Firm* — Mintz Levin Cohn Ferris Glovsky and Popeo, P.C.

(57) ABSTRACT

A cable sealing device for sealing a cable passing through a first and second surface in a fuel dispenser can include a first sealing element extending in a first radial direction of the cable and configured to surround at least a portion of the cable and to seal an opening in the first surface, and a second sealing element extending in a second radial direction of the cable and configured to surround at least a portion of the cable and to seal an opening in the second surface. The extension of the first sealing element in the first radial direction is smaller than the extension of the second sealing element in the second radial direction.

15 Claims, 3 Drawing Sheets

(51) Int. Cl.
*H02G 3/22* (2006.01)
*B67D 7/06* (2010.01)
*H05K 5/02* (2006.01)
*H01B 17/26* (2006.01)

(56) References Cited

U.S. PATENT DOCUMENTS

| | | | | |
|---|---|---|---|---|
| 4,461,401 A | * | 7/1984 | Sasnett, Jr. | B67D 7/22 222/130 |
| 4,576,312 A | * | 3/1986 | Swick, Jr. | B67D 7/06 222/173 |
| 4,986,445 A | * | 1/1991 | Young | B67D 7/32 137/560 |
| 5,170,017 A | * | 12/1992 | Stanevich | H02G 15/013 174/151 |
| 5,867,403 A | * | 2/1999 | Sasnett, Jr. | B67D 7/08 137/2 |
| 6,995,316 B1 | | 2/2006 | Goto | |
| 6,995,317 B1 | | 2/2006 | Dzurilla | |
| 8,981,229 B2 | * | 3/2015 | Larsson | H02G 3/22 16/2.1 |
| 2004/0073525 A1 | * | 4/2004 | Stanley | B67D 7/04 705/413 |
| 2015/0148942 A1 | * | 5/2015 | DeWitt | B67D 7/3218 700/231 |

* cited by examiner

CABLE SEALING DEVICE IN A FUEL DISPENSER

CROSS REFERENCE TO RELATED APPLICATIONS

This application is a continuation of U.S. patent application Ser. No. 13/576,947 filed on Nov. 27, 2012 and entitled "Cable Sealing Device" which is a national stage application under 35 U.S.C. §371(c) of PCT Patent Application No. PCT/EP2010/051308, filed on Feb. 3, 2010 and entitled "Cable Sealing Device," the entire contents of which are incorporated herein by reference in their entireties.

BACKGROUND

Embodiments of the present invention relate to a cable sealing device for sealing a cable passing through a first and second surface.

When passing a cable through a first and a second surface, the criteria of sealing that cable in relation to said two surfaces naturally differ depending of the environmental circumstances. If the surfaces are part of an arrangement handling an inflammable substance, such as a fuel dispensing unit, the criteria of the sealing is high.

It is well-known that fuel, such as petrol or diesel, is a highly inflammable substance that must be handled with extreme care. An inherent property of fuel, that increases the risks of its handling, is its high volatility. For the above reasons, safety standards such as the UL standards for safety in North America and the ATEX directive have been created for fuel handling in order to reduce the thereby induced risks.

Fuel dispensing units generally comprise electronics in order for the user to be able to control the hydraulics of the fuel dispensing unit and refuel e.g. a vehicle. The electronics of the fuel dispensing unit can provide an increased risk in that for instance sparks from electronic circuitry and/or heat radiated from the electronic wiring and circuitry could ignite the fuel vapors. As a safety measure, the hydraulics and the electronics of a fuel dispensing unit are located in separate compartments or modules. However, in order to make the fuel dispensing unit operational it is necessary to pull cables between the hydraulics compartment and the electronics compartment, thereby risk leading inflammable substance from the hydraulic compartment up and into the electronics compartment. Accordingly, a reliable sealing of a cable passing between these compartments is crucial.

There is a number of different solutions for sealing a cable available on the market today. The technique used today is based on mounting the sealing device after the cable has been positioned. The cable to be sealed must be pulled through the surfaces in question before a gasket and some kind of sealing element is provided for each surface passed by the cable. A problem with sealing devices for cables according to this technique and other prior art is the vast amount of parts involved as well as the mounting of the same. This procedure is both troublesome and time consuming.

SUMMARY

Embodiments of the present invention provide an improvement of the above technique and prior art. More particularly, an embodiment of the present invention provides an improved cable sealing device containing a decreased amount of parts and contributing to a simplified mounting of the same. Further, an embodiment of the present invention provides an electronics module for a fuel dispensing unit, a fuel dispensing unit and a method for sealing an opening in a first surface and an opening in a second surface.

These and other objects as well as advantages that will be apparent from the following description of the present invention are achieved by a cable sealing device for sealing a cable passing through a first and second surface according to embodiments of the present invention.

According to an embodiment a cable sealing device for sealing a cable passing through a first and second surface is provided. The cable sealing device comprises a first sealing element extending in a first radial direction of the cable and configured to surround at least a portion of the cable and to seal an opening in the first surface, and a second sealing element extending in a second radial direction of the cable and configured to surround at least a portion of the cable and to seal an opening in the second surface. The extension of the first sealing element in the first radial direction is smaller than the extension of the second sealing element in the second radial direction. This is advantageous in that the cable sealing device is constituted by a small number of parts and the mounting of the same is simplified in relation to prior art. Since the extension of the first sealing element in the first radial direction is smaller than the extension of the second sealing element in the second radial direction, the cable sealing device may be provided on the cable before it is passed through the surfaces to be sealed. Thus, the cable is automatically sealed when the first and second sealing element reaches the first and second surface, thereby simplifying the mounting to a great extent. In view of the above, the costs for manufacturing and mounting of the cable sealing device are decreased.

The first sealing element and second sealing element may be integrally formed, which is advantageous in that is decreases the amount of parts even further.

The extension of the first sealing element and the second sealing element may have the same length in all radial directions of the cable, thereby centering the cable in each sealing element. However, the length of the extension of the first sealing element and the length of the extension of the second sealing element differ due to different radii of the two sealing elements.

The cable sealing device may be attached to the cable to be sealed, which is advantageous in that the cable can be manufactured and distributed already provided with the cable sealing device. The mounting of the cable and the cable sealing device is thus further facilitated.

The second sealing element may have a flange adapted to fit into a corresponding recess of the opening to be sealed for retaining the second sealing element at said opening, which is advantageous in that a tight sealing will be ensured. Also, this way the amount of parts of the cable sealing device is kept down since no further locking device for the second sealing device will be needed.

The cable sealing device may further comprise a locking device for locking the first sealing element in the opening to be sealed, which is advantageous in that a tight sealing will be ensured.

The first sealing element and said second sealing element each may comprise a gasket for tight sealing against the openings to be sealed, which is advantageous in that a tight sealing will be ensured.

The first sealing element and the second sealing element may be spaced apart such that a space may be allowed between the first and second surface when the first sealing element seals the opening in the first surface and the second sealing element seals the opening in the second surface. If a cable is drawn from a compartment potentially containing an inflammable substance, such as a hydraulics compartment of a fuel dispensing unit, to another compartment, such as an electronics compartment of a fuel dispensing unit, there is a risk that the cable will bring about the inflammable substance and thus potentially increase the risk of explosion. When the cable runs through the space formed between the first and second surface, it is ventilated such that any inflammable substance which may have left the hydraulics compartment along the cable is neutralized.

According to an aspect of the invention, an electronics module for a fuel dispensing unit, is provided. The electronics module comprising a first compartment having a first opening, a second compartment having a second opening, a cable extending between the first and the second compartment through the first and the second opening, a cable sealing device configured to seal the first opening in the first surface and the second opening in the second surface. The cable sealing device comprises: a first sealing element extending in a first radial direction of the cable and configured to surround at least a portion of the cable and to seal an opening in the first surface; and a second sealing element extending in a second radial direction of the cable and configured to surround at least a portion of the cable and to seal an opening in the second surface, wherein the extension of the first sealing element in the first radial direction is smaller than the extension of the second sealing element in the second radial direction.

According to an embodiment of the invention, a fuel dispensing unit for refueling motor vehicles is provided. The fuel dispensing unit comprises a cable sealing device comprising: a first sealing element extending in a first radial direction of the cable and configured to surround at least a portion of the cable and to seal an opening in the first surface; and a second sealing element extending in a second radial direction of the cable and configured to surround at least a portion of the cable and to seal an opening in the second surface, wherein the extension of the first sealing element in the first radial direction is smaller than the extension of the second sealing element in the second radial direction.

According to another embodiment of the invention, the invention relates to a method for sealing an opening in a first surface and an opening in a second surface. The method comprises providing a cable with a sealing device comprising: a first sealing element extending in a first radial direction of the cable and configured to surround at least a portion of the cable and to seal an opening in the first surface; and a second sealing element extending in a second radial direction of the cable and configured to surround at least a portion of the cable and to seal an opening in the second surface, wherein the extension of the first sealing element in the first radial direction is smaller than the extension of the second sealing element in the second radial direction; and wherein the first sealing element seals the opening in the first surface and the second sealing element seals the opening in the second surface.

According to another embodiment a fuel dispensing unit for refueling motor vehicles is provided. The fuel dispensing unit comprises an electronics module comprising: a first compartment having a first opening in a first surface; a second compartment having a second opening in a second surface; a cable extending between the first and the second compartment through the first and second opening; and a cable sealing device. The cable sealing device comprising: a first sealing element extending in a first radial direction of the cable and configured to surround at least a portion of the cable and to seal an opening in the first surface; and a second sealing element extending in a second radial direction of the cable and configured to surround at least a portion of the cable and to seal an opening in the second surface, wherein the extension of the first sealing element in the first radial direction is smaller than the extension of the second sealing element in the second radial direction.

Generally, all terms used in the claims are to be interpreted according to their ordinary meaning in the technical field, unless explicitly defined otherwise herein. All references to "a/an/the [element, device, component, means, etc]" are to be interpreted openly as referring to at least one instance of said element, device, component, means, etc., unless explicitly stated otherwise.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION

Figure 1:
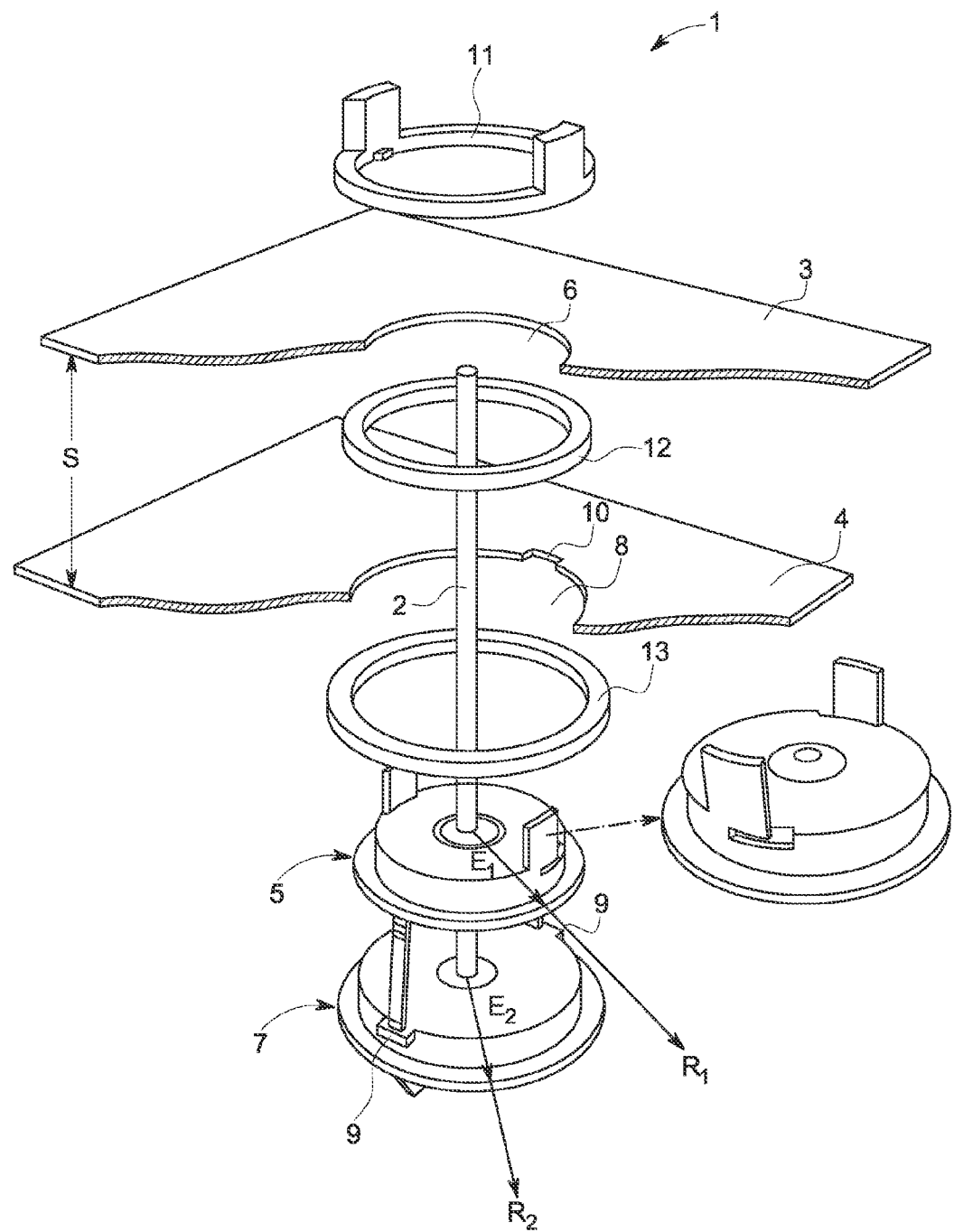
FIG. 1 is a perspective view of a cable sealing device according to an aspect of the invention when unassembled.

FIG. 1 illustrates a cable sealing device 1 according to one embodiment of the present invention when unassembled. The cable sealing device 1 is adapted to seal a cable 2 passing through a first surface 3 and a second surface 4, preferably in an electronics module of a fuel dispensing unit. The cable sealing device 1 has a first sealing element 5 extending in a first radial direction $R_1$ of the cable 2 surrounding the cable 2, and is adapted to seal an opening 6 in the first surface 3. The cable sealing device 1 further has a second sealing element 7 extending in a second radial direction $R_2$ of the cable 2 surrounding the cable 2, and is adapted to seal an opening 8 in the second surface 4. According to an alternative embodiment of the present invention the first 5 and second 7 sealing elements need not entirely surround the cable 2. That is, depending on specific sealing requirements the sealing elements 5, 7 may partially surround the cable so as to allow openings in the sealing elements 5, 7. This alternative embodiment may be advantageous when a less strict sealing is called for, e.g. when sealing different portions of the electronics module, wherein the openings in the sealing elements may comprise dust filters allowing air, but not dust, to flow between different portions of the electronics module. The extension $E_1$ of the first sealing element 5 in the first radial direction $R_1$ is smaller than the extension $E_2$ of the second sealing element 7 in the second radial direction $R_2$. The first sealing element 5 is preferably integrally formed and the extension $E_1$ preferably has the same length in all radial directions of the cable 2. The second sealing element 7 is preferably also integrally formed and the extension $E_2$ preferably has the same length in all radial directions of the cable 2. In order to facilitate assembling and sealing of the cable 2, the cable sealing device 1 is attached to the cable 2 to be sealed upon delivery. That is to say, when the cable 2 is distributed, it is already provided with the cable sealing device 1. The second sealing element 7 has two flanges 9 adapted to fit into corresponding recesses 10 of the opening 8 to be sealed for retaining the second sealing element 7 at the opening 8. The two flanges 9 are guided through the corresponding recesses 10, after which the second sealing element 7 is rotated in relation to the second surface 4, such that the second sealing element 7 is locked against the second surface 4. The cable sealing device 1 has a locking device 11 for locking the first sealing element 5 in the opening 6 to be sealed. The locking device 11 has two flanges adapted to fit into corresponding recesses provided in the first sealing element 5 for retaining the first sealing element 5 at the opening 6. The two flanges of the locking device are guided through the corresponding recesses of the first sealing element 5, after which the locking device 11 is rotated in relation to the first sealing element 5, such that the first sealing element 5 is locked against the second surface 4 by means of the locking device 11. The first sealing element 5 and the second sealing element 7 each comprises a gasket 12, 13 for tight sealing against the openings 6, 8 to be sealed in the first and second surface 3, 4. The first sealing element 5 and the second sealing element 7 are spaced apart such that a space S is allowed between the first and second surface 3, 4 when the first sealing element 5 seals the opening 6 in the first surface 3 and the second sealing element 7 seals the opening 8 in the second surface 4.

Figure 2:
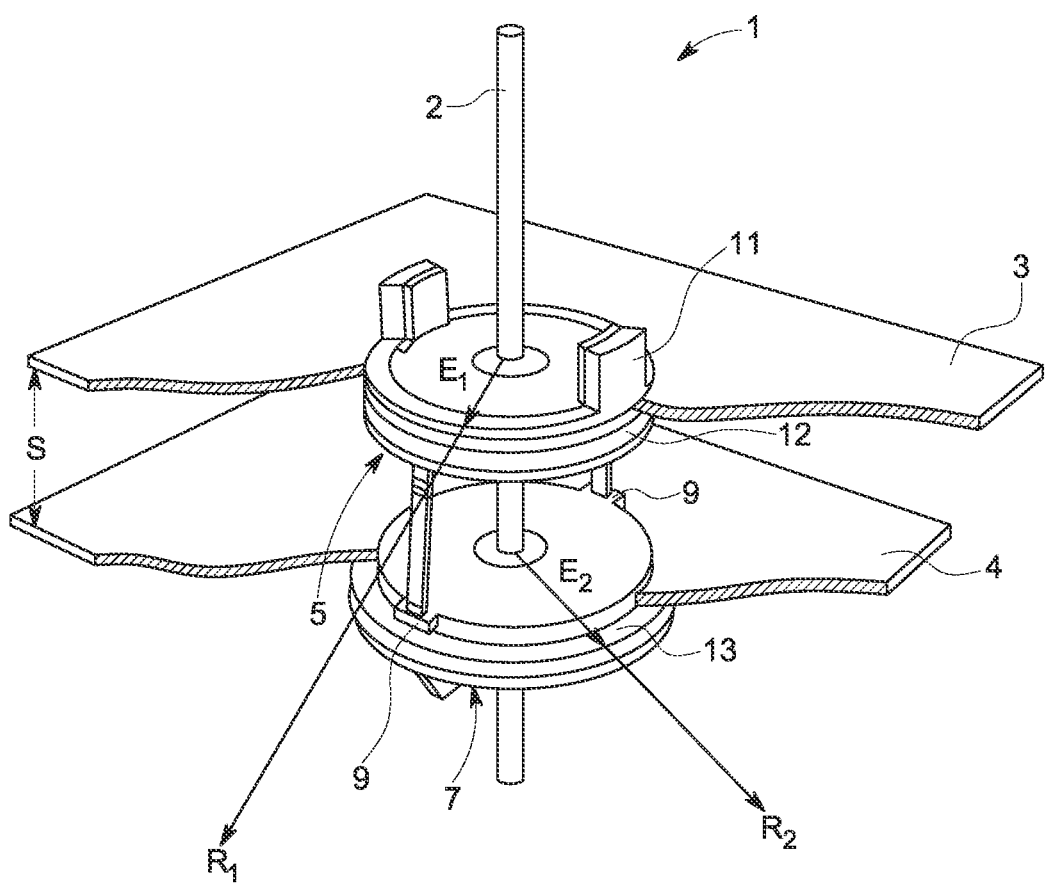
FIG. 2 is a perspective view of the cable sealing device when assembled and sealing against a first and a second surface.

In FIG. 2, the cable sealing device 1 is illustrated when assembled. The gasket 12 of the first sealing member 5 abuts against the underside of the first surface 3 and the locking device 11 abuts against the upper side of the first surface 3, thereby sealing the opening 6. The gasket 13 of the second sealing member 7 abuts against the underside of the second surface 4 and the flanges 9 abuts against the upper side of the second surface 4, thereby sealing the opening 8.

Figure 3:
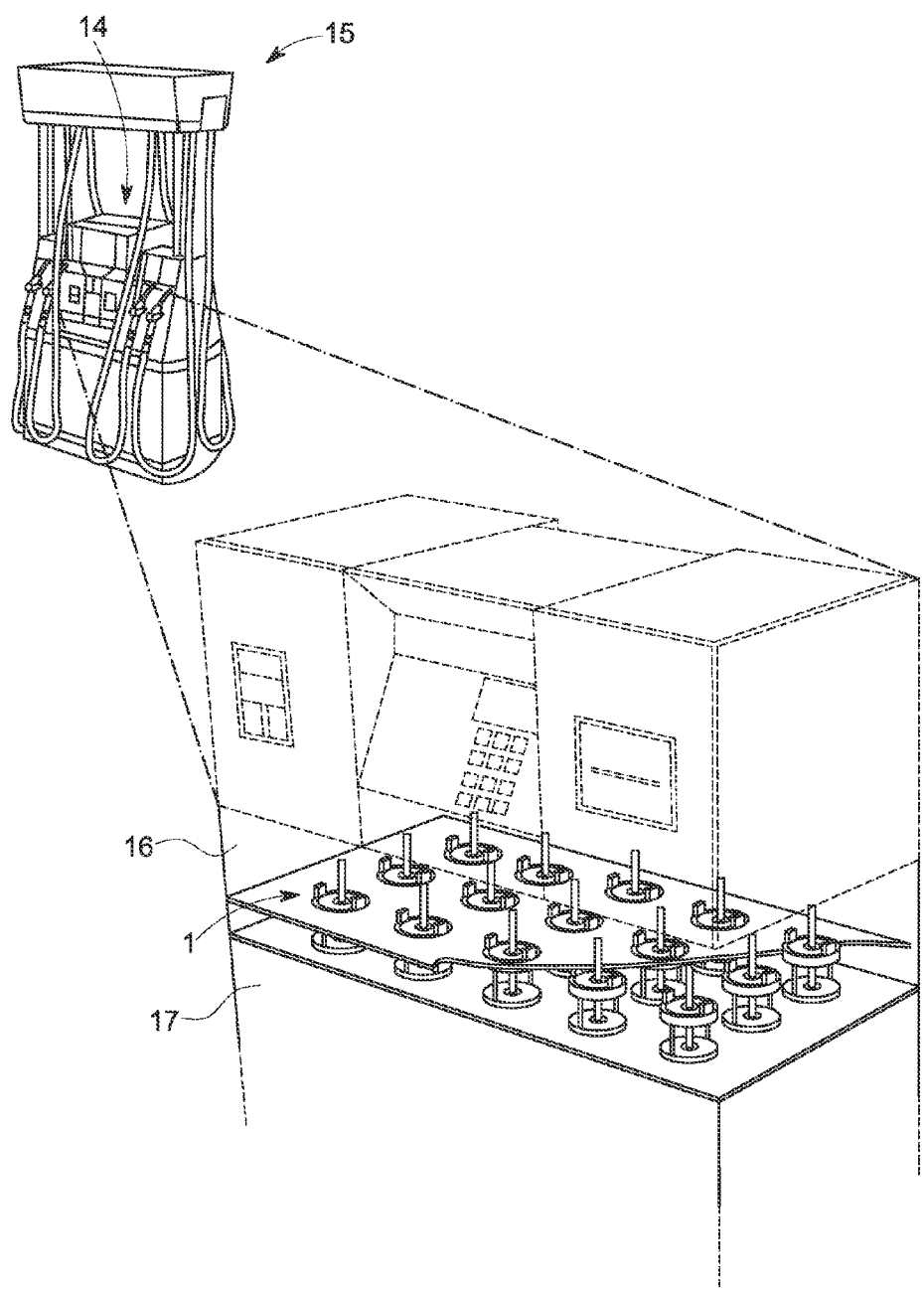
FIG. 3 is a perspective view of a fuel dispensing unit comprising an electronics module having a plurality of cable sealing devices.

FIG. 3 illustrates an electronics module 14 provided in a fuel dispensing unit 15. The electronics module 14 has a first compartment 16 having a plurality of first openings 6 in the first surface 3, and a second compartment 17 having a plurality of second openings 8 in the second surface 4. Each first and second opening 6, 8 is sealed by means of a cable sealing device 1 attached to each cable 2 extending between the first and the second compartment 16, 17 through said first and second opening 6, 8.

When a cable is drawn from one compartment to another, the need for proper sealing depends on the environmental circumstances. If a cable for example is to be pulled from the hydraulics compartment up and into the electronics compartment of a fuel dispensing unit, there is a risk of bringing inflammable substances into the electronics compartment and thus increasing the risk of explosion. Accordingly, the requirements regarding that type of sealing are high. The requirements may be lowered by letting the cable extend through an air gap between the compartments through which it is drawn. That is to say, it is preferred if the cable extend from a first compartment, i.e. the hydraulics compartment of a fuel dispensing unit, through an air gap where the cable is subjected to ventilation by air and up and into a second compartment, i.e. the electronics compartment of a fuel dispensing unit. As mentioned above, according to a preferred embodiment of the present invention, the cable sealing device is attached to the cable before being assembled. The cable carrying the cable sealing device is drawn from a first opening in a first surface in a first compartment up and into a second opening in a second surface in a second compartment. The first sealing element of the cable sealing device will seal the first opening in the first surface and the second sealing element will seal the second opening in the second surface, and at the same time create an air gap for the cable between the two compartments. The first sealing device is tightly locked against the first opening by means of a locking device. The second sealing device is tightly locked against the second opening by means of two flanges passed through a corresponding recess of the opening.

According to an embodiment of the invention an electronics module for a fuel dispensing unit is provided, comprising a cable sealing device according to the features above.

According to an embodiment of the invention a fuel dispensing unit for refueling motor vehicles is provided, comprising an electronics module according to the feature above.

According to another embodiment of the invention a method for sealing an opening in a first surface and an opening in a second surface is provided.

The cable sealing device according to embodiments of the present invention is constituted by a small number of parts and the mounting of the same is simplified in relation to prior art. Since the extension of the first sealing element in the first radial direction is smaller than the extension of the second sealing element in the second radial direction, the cable sealing device may be provided on the cable before it is passed through the surfaces to be sealed. Thus, the cable is automatically sealed when the first and second sealing element reaches the first and second surface, thereby simplifying the mounting to a great extent. In view of the above, the costs for manufacturing and mounting of the cable sealing device are decreased.

The first sealing element and second sealing element may be integrally formed, which may decrease the amount of parts even further.

The extension of the first sealing element and the second sealing element may have the same length in all radial directions of the cable, thereby centering the cable in each sealing element. However, the length of the extension of the first sealing element and the length of the extension of the second sealing element differ due to different radii of the two sealing elements.

The cable sealing device may be attached to the cable to be sealed, allowing the cable to be manufactured and distributed already provided with the cable sealing device. The mounting of the cable and the cable sealing device is thus further facilitated.

The second sealing element may have a flange adapted to fit into a corresponding recess of the opening to be sealed for retaining the second sealing element at said opening, such that a tight sealing will be ensured. Also, this way the amount of parts of the cable sealing device is kept down since no further locking device for the second sealing device will be needed.

The cable sealing device may further comprise a locking device for locking the first sealing element in the opening to be sealed, ensuring a tight sealing.

The first sealing element and said second sealing element each may comprise a gasket for tight sealing against the openings to be sealed, which also ensures a tight sealing.

The first sealing element and the second sealing element may be spaced apart such that a space may be allowed between the first and second surface when the first sealing element seals the opening in the first surface and the second sealing element seals the opening in the second surface. If a cable is drawn from a compartment potentially containing an inflammable substance, such as a hydraulics compartment of a fuel dispensing unit, to another compartment, such as an electronics compartment of a fuel dispensing unit, there is a risk that the cable will bring about the inflammable substance and thus potentially increase the risk of explosion. When the cable runs through the space formed between the first and second surface, it is ventilated such that any inflammable substance which may have left the hydraulics compartment along the cable is neutralized.

Another embodiment of the present invention relates to a fuel dispensing unit for refueling motor vehicles, comprising a cable sealing device or an electronics module according to the features above.

The invention has mainly been described above with reference to a few embodiments. However, as is readily appreciated by a person skilled in the art, other embodiments than the ones disclosed above are equally possible within the scope of the invention, as defined by the appended claims.

What is claimed is:

1. A fuel dispenser, comprising:
   an electronics module;
   a hydraulics module;
   first and second surfaces extending between the electronics module and the hydraulics module, the first and second surfaces being spaced apart to define an air gap therebetween;
   a cable extending from the hydraulics compartment, through a first opening in the first surface, through the air gap, through a second opening in the second surface, and into the electronics module;
   a first sealing element surrounding the cable and disposed in sealing engagement with the first opening in the first surface;
   a second sealing element surrounding the cable and disposed in sealing engagement with the second opening in the second surface; and
   a locking device separate from the first and second sealing elements and configured to engage and lock the first sealing element such that the opening in the first surface is positioned between the locking device and the first sealing element.

2. The fuel dispenser of claim 1, wherein the first and second sealing elements are attached to the cable.

3. The fuel dispenser of claim 1, wherein the second sealing element has a flange configured to fit into a corresponding recess of the second opening in the second surface for retaining the second sealing element at the second opening in the second surface.

4. The fuel dispenser of claim 1, wherein the first sealing element and the second sealing element each include a gasket for tight sealing against the openings in the first and second surfaces.

5. The fuel dispenser of claim 1, wherein the first sealing element has a diameter that is less than a diameter of the second sealing element such that the first sealing element can pass through the second opening.

6. A fuel dispenser, comprising:
   a housing having
      an electronics module having first and second compartments,
      a first opening extending through a first surface separating the first and second compartments,
      a second opening extending through a second surface of the second compartment, and
      a cable extending through the first and second openings; and
   a cable sealing device comprising
      a first sealing element surrounding the cable and sealing the first opening, and
      a second sealing element surrounding the cable and sealing the second opening, the second sealing element having at least one flange extending into a corresponding recess of the second opening in the second surface, and the second sealing element being rotatable with respect to the second surface to lock the second sealing element at the second opening,
      wherein the first sealing element extends in a first radial direction of the cable and the second sealing element extends in a second radial direction of the cable, the extension of the first sealing element in the first radial direction is smaller than the extension of the second sealing element in the second radial direction.

7. The fuel dispenser of claim 6, wherein the extension of the first sealing element has the same length in all radial directions of the cable.

8. The fuel dispenser of claim 6, wherein the extension of the second sealing element has the same length in all radial directions of the cable.

9. The fuel dispenser of claim 6, wherein the first and second sealing elements are attached to the cable.

10. The fuel dispenser of claim 6, further comprising a locking device separate from the first and second sealing elements and configured to engage and lock the first sealing element such that the opening in the first surface is positioned between the locking device and the first sealing element.

11. The fuel dispenser of claim 6, wherein the first sealing element and the second sealing element each include a gasket for tight sealing against the openings in the first and second surfaces.

12. A fuel dispenser, comprising:
   a housing comprising
      first and second compartments,
      a first opening extending through a surface separating the first and second compartments,
      a second opening extending through a surface of the second compartment, and
      a cable extending through the first and second openings;
   a cable sealing device comprising
      a first sealing element surrounding the cable and sealing the first opening, and
      a second sealing element surrounding the cable and sealing the second opening; and
   a locking device separate from the first and second sealing elements and configured to engage and lock the first sealing element such that the opening in the first surface is positioned between the locking device and the first sealing element.

13. The fuel dispenser of claim 12, wherein the first compartment is an electronics module and the second compartment is a hydraulics module.

14. The fuel dispenser of claim 12, wherein the first sealing element and the second sealing element are spaced apart such that an air gap is disposed between the first and second surfaces.

15. The fuel dispenser of claim 12, wherein the second sealing element has at least one flange extending into a corresponding recess of the second opening in the second surface, and the second sealing element is rotatable with respect to the second surface to lock the second sealing element at the second opening.

* * * * *